(12) United States Patent
Yokomichi

(10) Patent No.: US 11,778,813 B2
(45) Date of Patent: Oct. 3, 2023

(54) MEMORY SUBWORD DRIVER LAYOUT

(71) Applicant: Micron Technology, Inc., Boise, ID (US)

(72) Inventor: Masahiro Yokomichi, Hiroshima (JP)

(73) Assignee: Micron Technology, Inc., Boise, ID (US)

(*) Notice: Subject to any disclaimer, the term of this patent is extended or adjusted under 35 U.S.C. 154(b) by 130 days.

(21) Appl. No.: 17/171,906

(22) Filed: Feb. 9, 2021

(65) Prior Publication Data
US 2022/0254788 A1 Aug. 11, 2022

(51) Int. Cl.
*G11C 11/408* (2006.01)
*H10B 12/00* (2023.01)
*G11C 5/06* (2006.01)
*H01L 29/417* (2006.01)

(52) U.S. Cl.
CPC ............ *H10B 12/50* (2023.02); *G11C 5/063* (2013.01); *G11C 11/4085* (2013.01); *H01L 29/41775* (2013.01)

(58) Field of Classification Search
CPC ..... G11C 11/4085; G11C 5/025; G11C 5/063; G11C 8/08; G11C 8/14; H01L 27/10897; H01L 29/41775
See application file for complete search history.

(56) References Cited

U.S. PATENT DOCUMENTS

| | | | |
|---|---|---|---|
| 2013/0058155 A1* | 3/2013 | Callen | H01L 27/0207 365/154 |
| 2018/0166119 A1* | 6/2018 | Jeong | G11C 5/02 |

\* cited by examiner

*Primary Examiner* — Eric A. Ward
(74) *Attorney, Agent, or Firm* — Dorsey & Whitney LLP (57) ABSTRACT

Semiconductor devices including active regions and gate electrodes are disclosed. An example semiconductor device according to the disclosure includes a gate electrode extending in a first direction, and first and second active regions extending in a second direction. The gate electrode has a side extending in the first direction. The first active region includes: a first center portion having a first width in the first direction; and a first end portion disposed at a first end of the first center portion, and having a second width in the first direction that is greater than the first width. The second active region includes: a second center portion having a third width in the first direction. The gate electrode overlaps along the side with portions of the first end portion and the second center portion.

21 Claims, 5 Drawing Sheets

MEMORY SUBWORD DRIVER LAYOUT

BACKGROUND

A semiconductor memory device, such as a Dynamic Random Access Memory (DRAM), includes a memory cell array having memory cells disposed at intersections between word lines and bit lines. The semiconductor memory device may include hierarchically structured main word lines (MWL) and word lines. The main word line is driven by a respective main word driver and is positioned at an upper hierarchy, and is selected by a first portion of a row address. The word line is driven by a respective subword driver and is positioned at a lower hierarchy, and is selected based on a corresponding main word line and a word driver line (FX) selected by a second portion of the row address.

During driving process of the subword lines, when the subword line is driven to an active potential, the memory cell is connected to the corresponding bit line. On the other hand, during a period in which the subword line is driven to a non-active potential, the memory cell and the bit line are kept in a cut-off state. In driving subword lines to the active potential, relatively high voltages are provided to the subword drivers of a memory mat in a memory cell array. In contrast, in driving the subword line to a nonactive potential, relatively low voltages are provided to the subword drivers of the memory mat. The relatively low voltages that are provided while the subword lines are driven to the non-active potential establishes a condition for transistors of the subword drivers that may result in leakage currents. For example, the relatively low voltage provided to a source of a transistor of the subword driver while a relatively high voltage is provided to a gate of the transistor and a relatively low voltage is provided to the drain of the transistor may result in voltage differences sufficient to induce leakage currents in the transistor. An example of leakage currents may be gate induced drain leakage (GIDL).

On the other hand, when the relatively high voltage provided to a source of a transistor of the subword driver while a relatively high voltage is provided to a gate of the transistor and a relatively low voltage is provided to the drain of the transistor may result in hot electron induced punch-through (HEIP). Hot electrons are accumulated at an edge of the drain of the transistor defined by an isolation region. The isolation region may be a shallow trench isolation (STI) structure including an insulating film such as a silicon dioxide (SiO2) film and a silicon nitride (SiN) film to fill the trenches. For example, the hot electrons are trapped through the SiO2 film and accumulate in the SiN film of the STI. The accumulated hot electrons affect an adjacent transistor's source, and as a result, lower a threshold voltage (Vth) of the adjacent transistor. The lower Vth of the adjacent transistor increases leakage currents in the transistor. The increase of leakage currents in the transistor result in accumulating more hot electrons in the edge of the drain of the transistor. Thus, the leak currents are increased in a recursive manner.

Leakage currents due to GIDL and HEIP increase power consumption by a semiconductor memory device. In systems where low power consumption is important, leakage currents may cause unacceptable power consumption. Therefore, reducing leakage currents in semiconductor memory devices may be desirable.

DETAILED DESCRIPTION

Certain details are set forth below to provide a sufficient understanding of examples of various embodiments of the disclosure. However, it is appreciated that examples described herein may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components. Shapes and dimensions of the various semiconductor structures shown by the drawings are not to scale. For example, the layout diagrams are provided merely as examples, and the shapes and dimensions may be modified for an actual semiconductor device.

Figure 1:
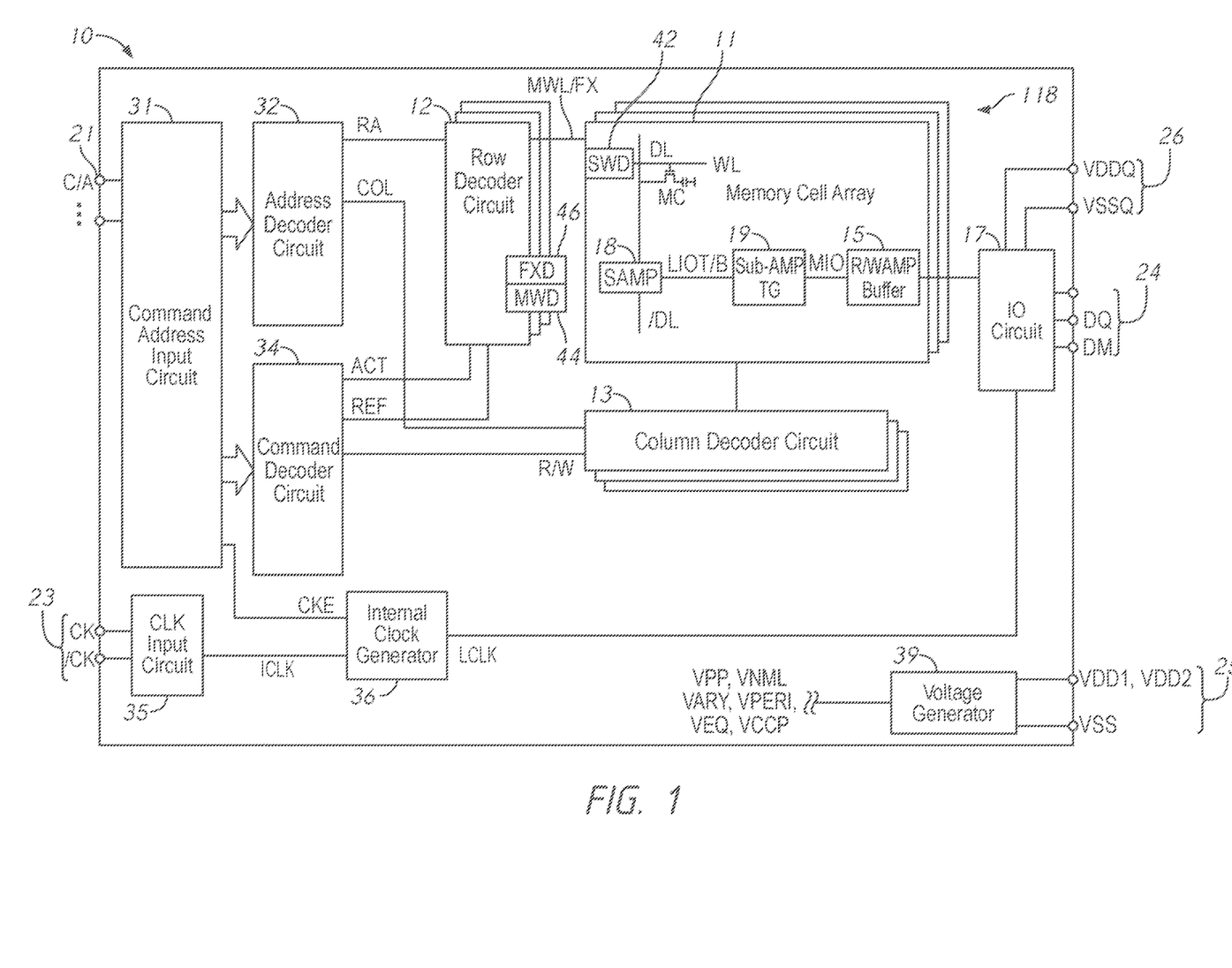
FIG. 1 is a block diagram of a semiconductor device according to some examples described in the disclosure.

FIG. 1 is a block diagram of a semiconductor device 10 according to some examples described in the disclosure. The semiconductor device 10 may be a dynamic random access memory (DRAM) in some embodiments of the disclosure. The semiconductor device 10 includes a memory cell array 11. The memory cell array 11 includes a plurality of word lines WL and a plurality of data lines DL that intersect with each other, with memory cells (MC) disposed at the intersections. The WLs may be driven by respective subword drivers SWD. For clarity, only one WL, SWD, DL, and MC are shown in FIG. 1. A plurality of main word lines MWL and word driver lines FX may be provided to respective SWDs in the memory cell array 11. For example, a selection of a main word line MWL and a word driver line FX is carried out by the row decoder circuit 12, and the selection of the data line DL is carried out by a column decoder circuit 13. In some examples, the word driver lines FX may be driven by respective word drivers FXD 46. The main word lines MWL may be driven by respective main word drivers (MWD) 44. For example, a memory device may have 128 main word lines and 128 main word drivers providing respective main word lines.

In some examples, the semiconductor device 10 may include multiple memory cell arrays 11 arranged in multiple memory banks. The semiconductor device 10 may also include multiple row decoder circuits 12 and multiple column decoder circuits, each coupled to a respective memory cell array 11.

With further reference to FIG. 1, sense amplifiers 18 are coupled to corresponding data lines DL and coupled to local I/O line pairs LIOT/B. Local IO line pairs LIOT/B are coupled to main IO line pairs MIOT/B via transfer gates TG 19 which function as switches to read/write amplifiers and buffers 15.

Turning to the explanation of a plurality of external terminals included in the semiconductor device 10, the plurality of external terminals includes command and address terminals 21, clock terminals 23, data terminals 24, and power supply terminals 25 and 26. The command and address terminals 21 are supplied with command and address signals CA. The CA signals provided to the command and address terminals 21 include commands and addresses. Addresses included in the CA signals are transferred via a command/address input circuit 31 to an address decoder circuit 32. The address decoder circuit 32 receives the addresses and supplies a decoded row address signal RA to the row decoder circuit 12, and a decoded column address signal COL to the column decoder circuit 13.

Commands included in the CA signals provided to the command and address terminals 21 are input to a command decoder circuit 34 via the command/address input circuit 31. The command decoder circuit 34 decodes the commands to provide various internal command signals. For example, the internal commands may include a row command signal to select a word line and a column command signal, such as a read command or a write command, to select a data line.

When a activation command is issued and a row address is timely supplied with the activation command, and a column address is timely supplied with a read command, read data is read from a memory cell MC in the memory cell array 11 designated by these row address and column address. More specifically, the row decoder circuit 12 selects a main word line MWL, word driver line FX, and word line WL indicated by the row address RA so that the associated memory cell MC is subsequently connected to the data line DL. Further, when the memory cell MC is selected by the row address and the associated row is activated by the activation command, the main word line M W L may be active and the word driver line FX may be active. This results in the word line WL being active. Conversely, when the memory cell MC is not selected, e.g., in a precharge operation, the word driver line FX may be inactive, and the main word line MWL may also be inactive. This drives the word line WL to a non-active potential, e.g., off-state word line voltage VNWL. With further reference to FIG. 1, the read data DQ is output externally from the data terminals 24 via a read/write amplifier 15 and an input/output circuit 17.

Similarly, when the activation command is issued and a row address are timely supplied with the activation command, and a column address is timely supplied with a write command, the input/output circuit 17 may receive write data DQ at the data terminals 24. The write data DQ is supplied via the input/output circuit 17 and the read/write amplifier 15 to the memory cell array 11 and written in the memory cell MC designated by the row address and the column address.

The clock terminals 23 are supplied with external clock signals CK and/CK, respectively. These external clock signals CK and/CK are complementary to each other and are supplied to a clock input circuit 35. The clock input circuit 35 receives the external clock signals CK and/CK and provides an internal clock signal ICLK. The internal clock signal ICLK is supplied to an internal clock generator 36 and thus a phase controlled internal clock signal LCLK is provided based on the received internal clock signal ICLK and a clock enable signal CKE from the command/address input circuit 31. In a non-limiting example, a DLL circuit can be used as the internal clock generator 36. The phase controlled internal clock signal LCLK is supplied to the input/output circuit 17 and is used as a timing signal for determining an output timing of the read data DQ.

The power supply terminals 25 are supplied with power supply voltages VDD1, VDD2, and VSS. These power supply voltages VDD1. VDD2, and VSS are supplied to an internal voltage generator circuit 39. The internal voltage generator circuit 39 provides various internal voltages, such as, VPP, VARY, VPERI, VEQ, VCCP, and VNWL.

The internal potentials VCCP, VNWL are potentials to be mainly used in the row decoder circuit 12, the main word drivers MWDs 44 and the word drivers FXDs 46. For example, a word driver FXD, when selected based upon the address signal ADD, may be configured to drive a potential on the word driver line FX to a VCCP level corresponding to a high potential (e.g., 3.1 V). When a row is in pre-charge state, an associated subword driver, responsive to an inactive signal on a main word line (MWL) and an inactive signal on a word driver line (e.g., FXT, FXB), may be configured to pull down the word line (WL) to the internal voltage VNWL (e.g. a non-active potential, which may be a negative voltage).

The internal potential VARY and VEQ are potentials to be used by the sense amplifier 18, transfer gates 19 and/or read/write amplifiers 15. When the sense amplifier 18 is activated, the read data read out is amplified by driving one of the paired data lines to a VARY level with the other one being driven to a VSS level. The internal potential VPERI is used as a power supply potential for most of the peripheral circuits, such as the command/address input circuit 31. By using the internal potential VPERI having a lower potential than the external potential VDD as the power supply potential of these peripheral circuits, it may be possible to reduce power consumption of the semiconductor device 10.

The power supply terminals 26 are supplied with power supply voltages VDDQ and VSSQ. These power supply voltages VDDQ and VSSQ are supplied to the input/output circuit 17. The power supply voltages VDDQ and VSSQ may be the same voltages as the power supply voltages VDD2 and VSS that are supplied to the power supply terminals 25, respectively. However the dedicated power supply voltages VDDQ and VSSQ may be used for the input/output circuit 17 so that power supply noise generated by the input/output circuit 17 does not propagate to the other circuit blocks of device 10.

Figure 2:
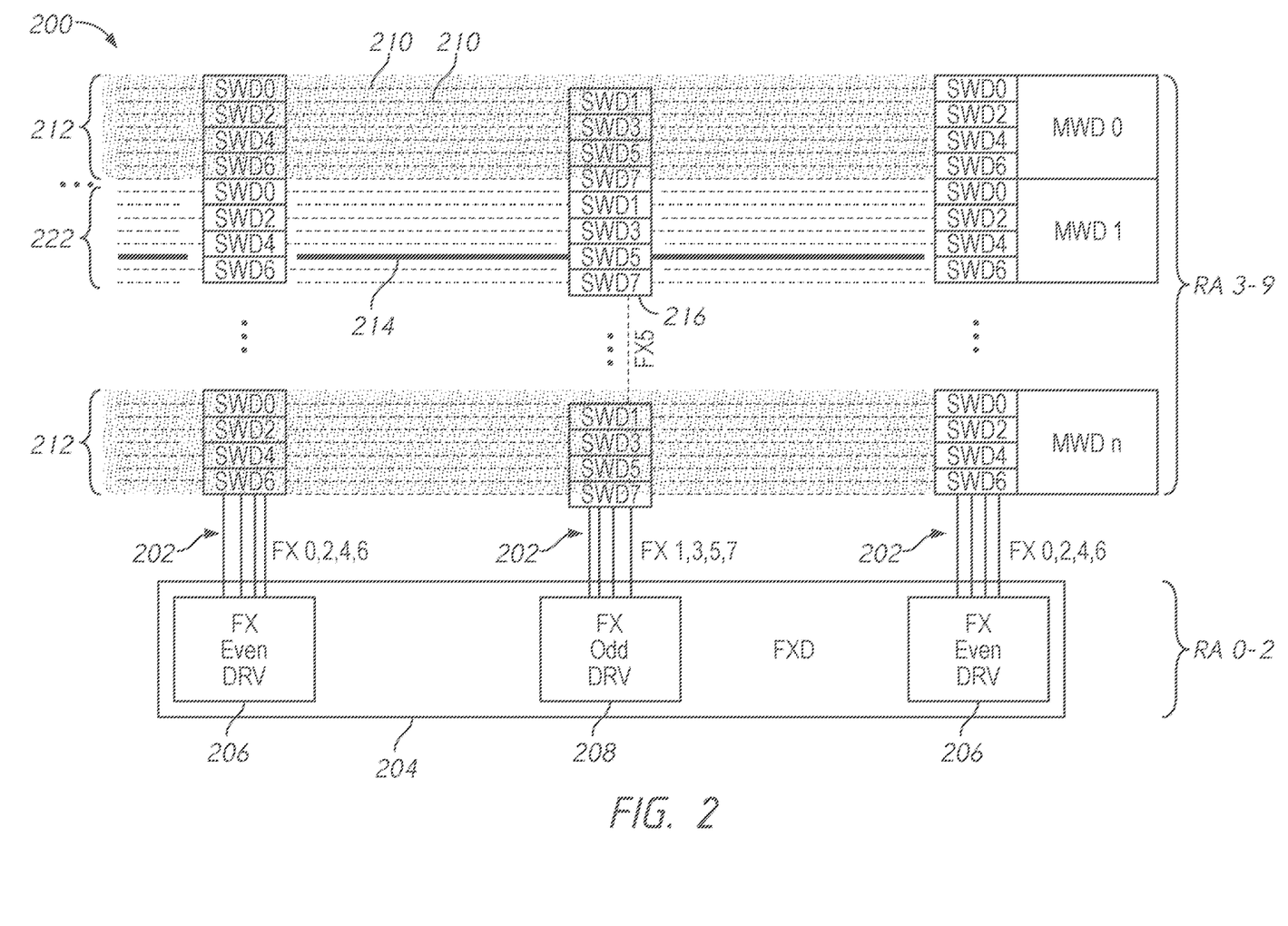
FIG. 2 is a schematic diagram of a portion of a memory bank according to some examples described in the disclosure.

FIG. 2 is a schematic diagram of a portion of a memory bank 200 according to some examples described in the disclosure. In some embodiments of the disclosure, the portion of the memory bank 200 may be included in one bank of the multiple banks in the memory cell array 11 of FIG. 1.

The portion of the memory bank 200 may include multiple word lines 210, each provided by a respective subword driver SWDj 216. For example, a word line 214 may be provided by a corresponding subword driver SWD5 associated with a main word line driven by a main word driver MWD1 and also associated with a word driver line 202 (e.g., FX5) associated with a word driver 208. In other words, for each subword driver, a corresponding main word line MWL and word driver line FX and non-active potential (e.g., off-state word line voltage VNWL) are provided. The signals on the main word lines MWLs and the word driver lines FXs may be provided by main word drivers MWD0-N and word drivers FXDs 204, based upon the row address RA.

A main word line MWL may extend over array regions of a respective memory mat to provide the main word signal to the subword driver rows SWD0-7 of the memory mat to activate those subword drivers SWD0-7. That is, when a main word driver MWD is activated, it may provide active main word signals to all the subword drivers SWD0-7 of the mat. As will be described below, a word driver line FX may include FXT and FXB that transmits a signal complementary to a signal of the FXT. In some examples, when the FXT is active, the FXB line is inactive. Conversely, the FXB may be active while the FXT is inactive. Each word driver line 202 of word driver FXD 204 provides word driver lines to at least one subword driver SWD in each mat. In the example shown in FIG. 2, the word driver FXD 204 includes even word drivers 206 and odd word drivers 208. The even word drivers 206 provide respective word driver lines to even-numbered subword drivers SWIX), SWD2, SWD4, and SWD6, of each memory mat and odd word drivers 208 provide respective word driver lines to odd-numbered subword drivers SWD1, SWD3, SWD5, and SWD7 of each memory mat. However other arrangements may be used in other examples. In the example shown in FIG. 2, each word driver line of the word driver 204 may be coupled to a corresponding subword driver SWD0-7 in each memory mat. For example, FX line 5 may be coupled to the subword driver SWD5 of each memory mat.

In the example operation shown in FIG. 2, a row address RA has indicated MWD1 should be activated and odd word driver 208 associated with word driver line FX5 should be activated. As shown by the shaded regions 212, word lines 210 associated with the inactive main word drivers MWD0, MWDn remain inactive, even the subword lines associated with word driver line FX5 are active. However, among the word lines 222 that are associated with activated MWD1, the word line 214 driven by subword driver SWD5 associated with activated MWD1 and FX5 is activated. By way of example, an activated MWD may be configured to provide an active signal on the associated main word line, and an activated word driver FXD may be configured to provide an active signal on the word driver line (e.g., FXT, FXB). Similarly, an activated subword driver may be configured to provide an active signal on the associated word line. Thus, a selected word line WL of the selected memory mat associated with MWD1 is driven to the active potential by the corresponding activated subword driver SWD5.

In some examples, the other subword drivers SW D of the selected memory mat drive the respective unselected word lines WL to the non-active potential (e.g., VNWL) to remain inactive. Subword drivers SWD of unselected memory mats MAT (e.g., memory mats associated with MWD0 and MWDn) remain deactivated, and the word lines WL of the unselected memory mats MAT are not provided a voltage, or instead, provided with a non-active potential (e.g., VNWL) in some examples. Whereas a subword driver SWD is coupled to a word driver FXD and a main word driver MWD, in order for a word line WL associated with the subword driver SWD to be activated, both the associated word driver FXD and the main word driver MWD must be activated.

Figure 3:
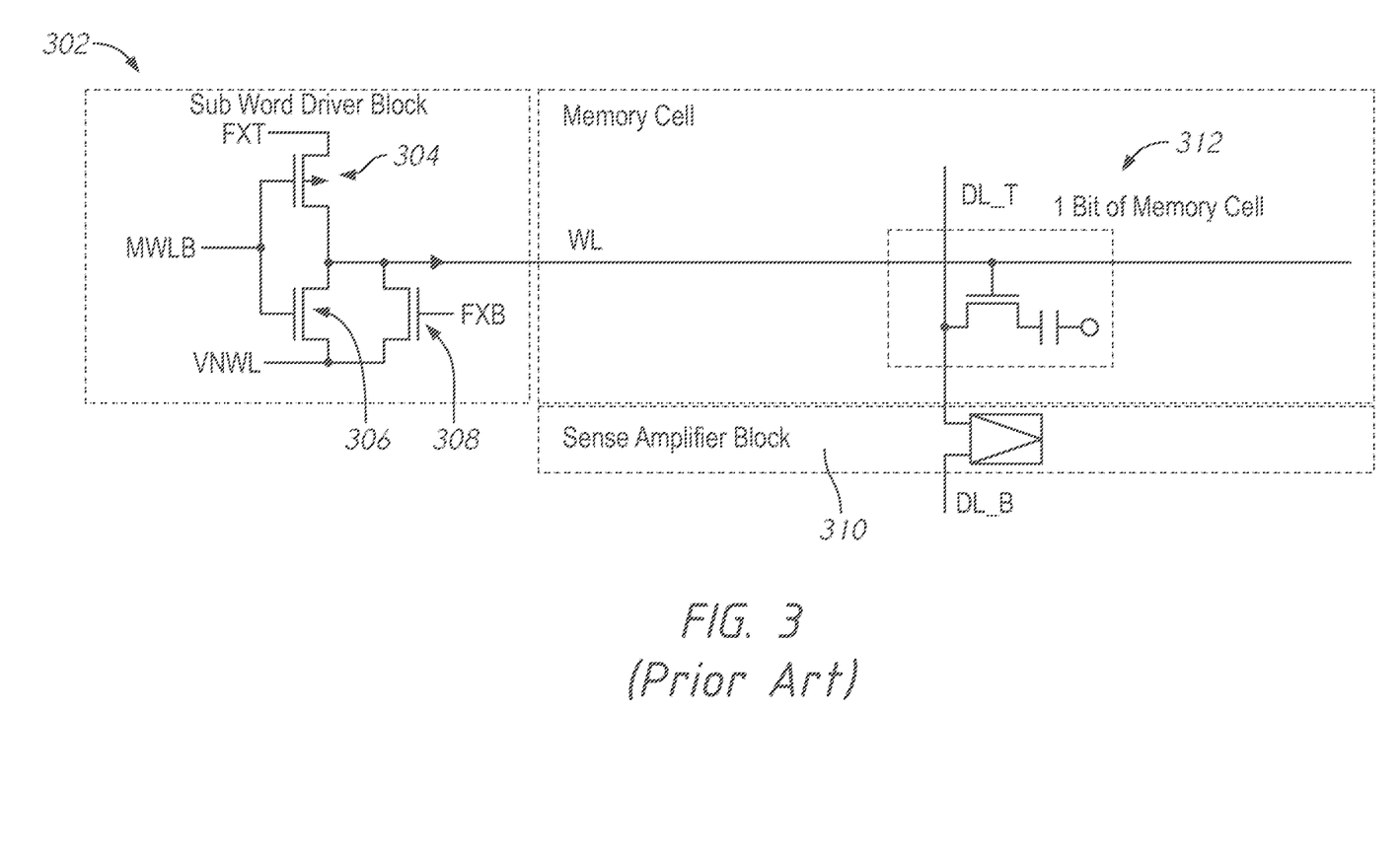
FIG. 3 is a schematic diagram of a subword driver and a memory cell.

FIG. 3 is a schematic diagram of a conventional subword driver and a memory cell. As shown in FIG. 3, the output of a subword driver 302 is coupled to a word line WL, which is coupled to memory cell 312. The memory cell 312 includes at least a transistor and a capacitor. The word line WL is connected to the gate of the transistor and the data line DL is connected to the drain/source (drain or source) of the transistor. The memory cell is capable of storing 1-bit data. The memory cell 312 is coupled to a sense amplifier 310 configured to sense a signal of the memory cell 312 on the data line DL and drive the signal to a desired voltage.

The subword driver 302 includes two transistors of different conductivity types (e.g., a p-channel type transistor 304 and an n-channel type transistor 306) serially coupled at the word line WL. A main word line MWL is coupled to the gates of the transistors 303 and 306. A word driver line FXT is coupled to the drain/source of the transistor 304, and the non-active potential VNWL is provided to the drain/source of the transistor 306. The word line WL is also coupled to the non-active potential VNWL through an n-channel type transistor 308. A word driver line FXB is coupled to the gate of the transistor 308.

The word line of the memory cell 312 is coupled to the subword driver 302, which operates responsive to the signals on the main word line signal MWL and the word driver line FXT. In operation, the transistors 304 and 306 are configured to provide an active/inactive signal on the word line WL. The n-channel type transistor 308 is used to prevent unselected word lines from floating. For example, when the main word line MWLB is active low, the transistor 304 is turned on and the transistor 306 is turned off. If FXT is inactive, the FXB will be active to turn on the transistor 308, which pulls down the potential at the word line WL to VNWL, preventing the word line from floating. As shown in FIG. 3, the subword driver 302 in the conventional circuit includes at least three transistors.

Figure 4:
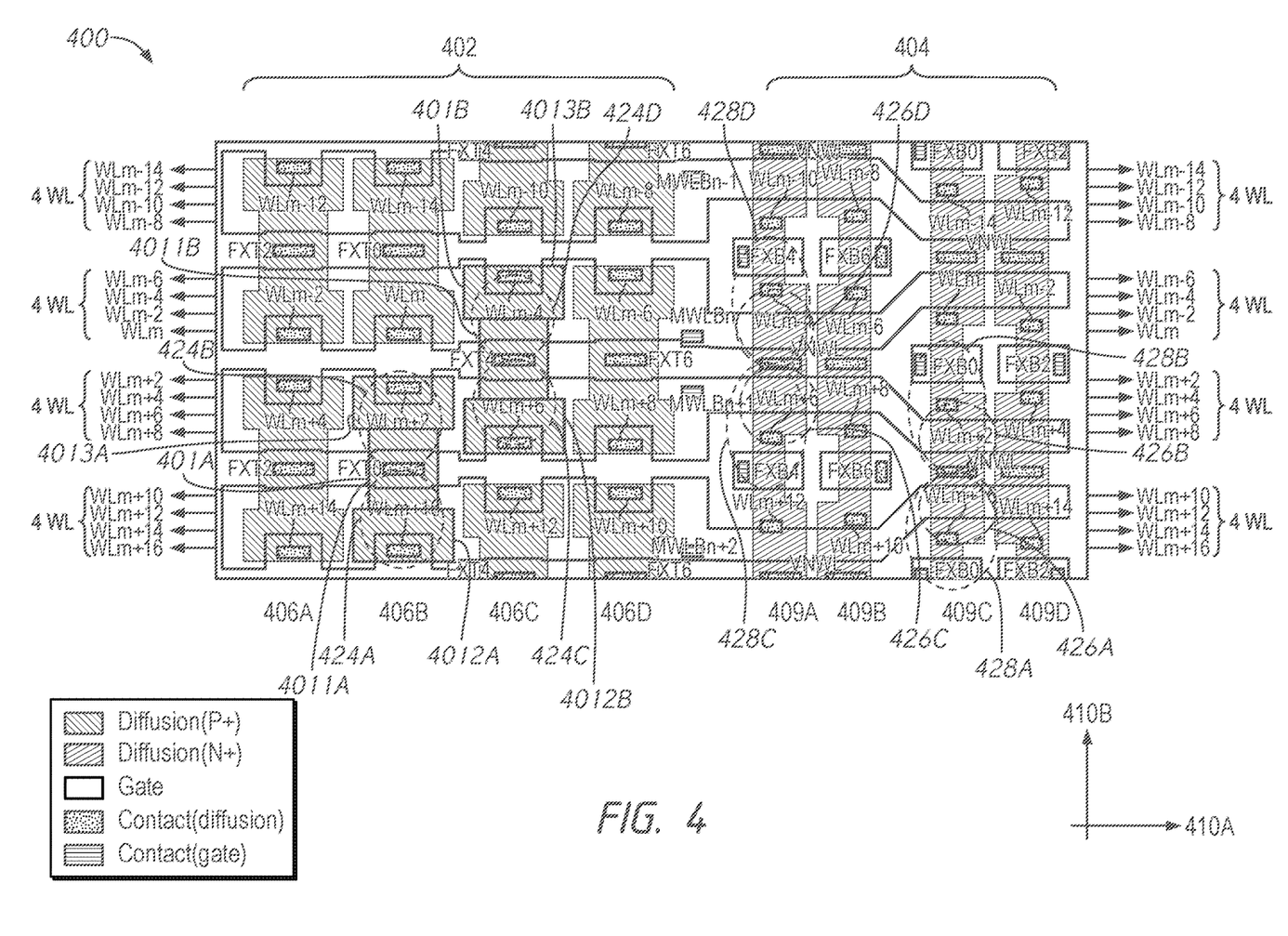
FIG. 4 is a plan view of an example layout diagram of subword drivers showing active regions according to some examples described in the disclosure.

FIG. 4 is a plan view of an example layout diagram of subword drivers showing active regions according to some examples described in the disclosure. In some examples, layout 400 may include a gate layer overlaid on a p-channel type area 402 and an n-channel type area 404 to form p-channel type or n-channel type transistors. As shown in FIG. 4, the p-channel type area has multiple sub-regions, e.g., 406A-D, each extending in a direction 410B. The n-channel type area has multiple sub-regions, e.g., 409A-D, each extending in the direction 410B. It is appreciated that, although only four sub-regions are shown, both the p-channel type area and n-channel type area may have any suitable number of sub-regions.

In some examples, the gate layer may include multiple gate electrodes, each extending in a direction 410A that is perpendicular to the direction 410B. Each gate electrode may be coupled to a respective main word line MWLB. In FIG. 4, four gate electrodes respectively for main word lines MWLBn−1, MWLBn, MWLBn+1, and MWLBn+2 are shown, where "n" is an integer. Although the layout 400 shows only a portion of the memory device, it is appreciated that additional gate electrodes for other main word lines may be included.

With further reference to FIG. 4, the layout 400 may also include contacts for active regions or gate layers. As shown, diffusion contacts may be arranged in an active region on each side of a gate. In the p-channel type area 402, gate electrodes may overlap with active regions including P+ diffusion materials to form respective p-channel type transistors. For example, the respective p-channel type transistors may be the p-channel type transistor 304 in FIG. 3. For example, p-channel type transistors 424A and 424B may be formed over respective gate electrodes in a P+ diffusion sub-region 406B. Also, p-channel type transistors 424C and 424D may be formed over respective gate electrodes in a P+ diffusion sub-region 406C. A contact on the active region may be coupled to a word line WLm+j or a word driver line (e.g., FXTj), where "m" and "j" are integers. A FXT word driver line (e.g., FXT0, FXT1, FXT2, FXT3) is connected to a common source/drain between adjacent main word lines (MWLB).

In some embodiments, p-channel type transistor 424A is formed over the gate electrode associated with MWLBn+2 with two contacts on each side of the gate electrode, where the two contacts are coupled to a word line (e.g., WLm+16)

and a word driver line (e.g., FXT0), respectively. Also, p-channel type transistor 424B is formed over the gate electrode associated with MWLBn+1 with two contacts on each side of the gate electrode, where the two contacts are coupled to a word line (e.g., WLm+2) and a word driver line (e.g., FXT0), respectively. Similarly, p-channel type transistor 424C is formed over the gate electrode associated with MWLBn+1 with two contacts on each side of the gate electrode, where the two contacts are coupled to a word line (e.g., WLm+6) and a word driver line (e.g., FXT4), respectively. Additionally, p-channel type transistor 424D is formed over the gate electrode associated with MWLBn with two contacts on each side of the gate electrode, where the two contacts are coupled to a word line (e.g., WLm−4) and a word driver line (e.g., FXT4), respectively.

In the embodiment of FIG. 4, FXT0 and FXT2 are coupled to respective common sources/drains between adjacent gate electrodes associated with MWLBn−1 and MWLBn. FXT0 and FXT2 are also coupled to respective common sources/drains between adjacent main word lines MWLBn+1 and MWLBn+2. FXT4 and FXT6 are coupled to respective common drains/sources between adjacent main word lines MWLBn and MWLBn+1. For each gate, on the opposite side from the common source/drain, a respective word line is coupled to the drain/source. Along the gate electrode associated with main word line MWLBn+1, a word line WLm+2 is coupled to the drain of the transistor 424B, opposite the common source with transistor 424A coupled to FXT0. The drain of the transistor 424A is coupled to a word line WLm+16, and the gate of the transistor 424A is coupled the gate electrode associated with main word line MWLBn+2. Also, along the gate electrode associated with MWLBn, a word line WLm−4 is coupled to the drain of the transistor 424D, opposite the common source with transistor 424C coupled to FXT4. Similarly, along the gate electrode associated with main word line MWLBn+1, a word line WLm+6 is coupled to the drain of the transistor 424C. This pattern repeats for additional word lines.

Each sub-region of the multiple sub-regions, e.g., 406A-D may include active regions. For example, in FIG. 4, the sub-region 406B may include an active region 401A and the sub-region 406C may include an active region 401B. The active region 401A may include drains/sources (e.g., drain and source regions) and channel regions between the respective drains and sources for the transistors 424A and 424B. The active region 401A includes end portions 4012A and 4013A, and a center portion 4011A between the end portions. One of the end portions 4012A may include the drain of the transistor 424A coupled to the word line WLm+16. Another end portion 4013A of the end portions may include the drain of the transistor 424B coupled to the word line WLm+2. The center portion 4011A of the active region 401A may include the common source between the transistors 424A and 424B coupled to FXT0. The active region 401B includes end portions 4012B and 4013B, and a center portion 4011B between the end portions. One end portion 4012B of the end portions may include the drain of the transistor 424C coupled to the word lines WLm+6. Another end portion 4013B of the end portions may include the drain of the transistor 424D coupled to the word line WLm−4. The center portion 4011B of the active region 401B may include the common source between the transistors 424A and 424B coupled to FXT4. The drain of the transistor 424B is included in the end portion 4013A of the active region 401A and the source of the transistor 424C is included in the center portion 4011B of the active region 401B. The drain of the transistor 424B and the source of the transistor 424C are disposed along the same side of the gate electrode associated with the main word line MWLBn+1 and on the sub-regions 406B and 406C adjacent to each other, respectively. Thus, the end portion 4013A including the drain of the transistor 424B and the center portion 4011B including the source of the transistor 424C may be adjacent to each other.

A width of the center portion 4011B of the active region 401B may be shorter than a width of the end portions 4012B and 4013B of the active region 401B. As a result, a distance between the end portion 4013A of the active region 401A including the drain of the transistor 424B and the center portion 4011B of the active region 401B including the source of the transistor 424C may be greater than a distance between the end portion 4013A of the active region 401A including the drain of the transistor 424B and the end portion 4012B of the active region 401B including the drain of the transistor 424C.

In the n-channel type area 404, the gate electrodes overlay with N+ diffusion sub-regions to form respective n-channel type transistors. In some embodiments, the respective n-channel type transistors may include the n-channel type transistor 306 and the n-channel type transistor 308 in FIG. 3. A contact on the active region may be coupled to a word line WLm+i or a non-active potential VNWL, where "i" is an integer. In other words, non-active potential VNWL and respective word lines are coupled to the source/drain of each transistor. A gate of each n-channel transistor may be coupled to a non-active potential VNWL, if the n-channel transistor functions as the n-channel type transistor 306. A gate of each n-channel transistor may be coupled to a FXB word driver line (e.g., FXB0, FXB1, FXB2, FXB3) that transmits a complementary signal of the FXT word driver line (e.g., FXT0, FXT1, FXT2, FXT3), if the n-channel transistor functions as the n-channel type transistor 308.

In some embodiments, transistor 426D is formed and coupled to main word line MWLBn at the gate, and transistor 428D is formed and coupled to FXB4 at the gate. The transistors 426D and 428D are further coupled to VNWL and WLm−4 at the respective sources/drains. Transistor 426C is formed and coupled to main word line MWLBn+1 at the gate, and transistor 428C is formed and coupled to FXB4 at the gate. The transistors 426C and 428C are further coupled to VNWL and WLm+6 at the respective sources/drains. Transistor 426B is formed and coupled to main word line MWLBn+1 at the gate, and transistor 428B is formed and coupled to FXB0 at the gate. The transistors 426B and 428B are further coupled to VNWL and WLm+2 at the respective sources/drains. Transistor 426A is formed and coupled to main word line MWLBn+2 at the gate, and transistor 428A is formed and coupled to FXB0 at the gate. The transistor 426A and 428A are further coupled to VNWL and WLm+16 at the respective sources/drains. This pattern repeats for additional word lines.

The transistors 424A, 426A and 428A may be included in a subword driver, as the subword driver 302 in FIG. 3. For example, the transistor 424A, 426A and 428A may be included as the transistors 304, 306 and 308 of FIG. 3, respectively, to form a subword driver that receives a main word line signal MWLBn+2 and complementary word line signals FXT0/FXB0 as input signals to either active or deactivate the word line WLm+16. Similarly, the transistors 424B, 426B and 428B may be included as the transistors 304, 306 and 308 of FIG. 3, respectively, to form a subword driver that receives a main word line signal MWLBn+1 and complementary word line signals FXT0/FXB0 as input signals to either active or deactivate the word line WLm+2. The transistors 424C, 426C and 428C may be included as the transistors 304, 306 and 308 of FIG. 3, respectively, to form a subword driver that receives a main word line signal MWLBn+1 and complementary word line signals FXT4/FXB4 as input signals to either active or deactivate the word line WLm+6. The transistors 424D, 426D and 428D may be included as the transistors 304, 306 and 308 of FIG. 3, respectively, to form a subword driver that receives a main word line signal MWLBn+1 and complementary word line signals FXT4/FXB4 as input signals to either active or deactivate the word line WLm−4.

In the example in FIG. 4, even-numbered word lines are shown in the layout 400, which may implement the subword driver 216 of FIG. 2 or the subword driver 302 of FIG. 3. With reference to FIGS. 2, 3 and 4, it is appreciated that the circuit implemented in the layout 400 may implement one or more subword drivers 302. For example, for a given memory cell array (e.g., a memory cell array 11 of FIG. 1), subword drivers associated with even-numbered word lines for the given memory cell array may be laid out in a similar manner as shown in FIG. 4 and arranged adjacent to one side of the memory cell array. Similarly, subword drivers associated with odd-numbered word lines for the memory cell array may be laid out in a similar manner as shown in FIG. 4 and arranged adjacent to another side of the memory cell array. In some embodiments of the disclosure, the layout of the subword drivers associated with the odd numbered word lines may be arranged in a mirror arrangement relative to the subword drivers associated with the even numbered word lines.

Figure 5:
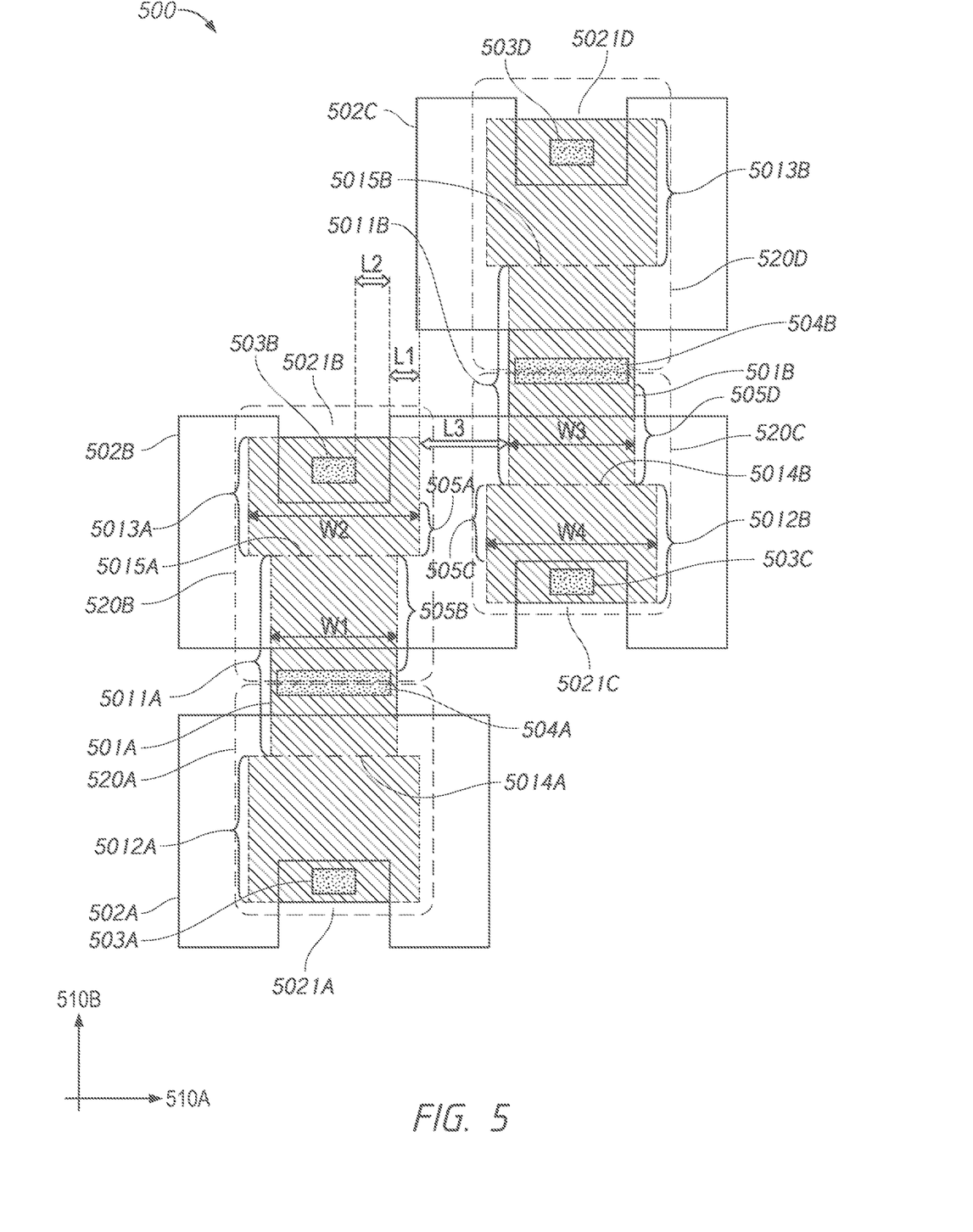
FIG. 5 is a plan view of an example layout diagram of portions of subword drivers showing active regions according to some examples described in the disclosure.

FIG. 5 is a plan view of an example layout diagram of portions of subword drivers showing active regions according to some examples described in the disclosure. In some examples, layout 500 of the portions of subword drivers may include active regions 501A and 501B that extend in a direction 510B. Each active region of the active regions 501A and 501B implements portions of multiple subword drivers. Each subword driver of the multiple subword drivers may be one of subword drivers 216 in the portion of the memory bank 200 of FIG. 2, or a subword driver 302 of FIG. 3.

An active region may include one or more drains, sources and channels. For example, an active region may include P+ diffusion materials to form p-channel type transistor. The active regions 501A and 501B include P+ diffusion materials and implement p-channel type transistors in the subword drivers. For example, the active region 501A may implement p-channel type transistors 520A and 520B, and the active region 501B may implement p-channel type transistors 520C and 520D. In some embodiments, the p-channel type transistors 520A, 520B, 520C and 520D may be the p-channel type transistors 424A, 424B, 424C and 424D of FIG. 4. Each p-channel type transistor of the p-channel type transistors 520A, 520B, 520C and 520D may include a source and a drain. For example, the p-channel type transistor 520A may include a drain 503A having a contact and a source 504A having a contact included in the active region 501A. The p-channel type transistor 520B may include a drain 503B having a contact and the source 504A having the contact shared with the p-channel type transistor 520A included in the active region 501A. The p-channel type transistor 520B may further include a channel region between the drain 503B and the source 504A. The channel region may include a portion 505A of a side of the drain 503B and a portion 505B of a side of the source 504A. The p-channel type transistor 520C may include a drain 503C having a contact and a source 504B having a contact. The p-channel type transistor 520C may further include a chan-nel region between the drain 503C and the source 504B. The channel region may include a portion 505C of a side of the drain 503c and a portion 5051) of a side of the source 504B. The p-channel type transistor 5201) may include a drain 503D having a contact and the source 504B having the contact shared with the p-channel type transistor 520C. In some embodiments, the drain 503B may be arranged adjacent to the portion 505D of the channel region of the p-channel type transistor 520C of the side of the source 504B. The drain 503C may be arranged adjacent to the portion 505B of the channel region of the p-channel type transistor 520B of the side of the source 504A.

In some examples, layout 500 of subword drivers may include gate electrodes 502A 502B and 502C. In some embodiments, each gate electrode of the gate electrodes 502A, 502B and 502C extends in a direction 510A that is perpendicular to the direction 510B on the plan view of FIG. 5. In the layout 500, each gate electrode of the gate electrodes 502A, 502B and 502C may overlap with at least portions of active regions 501A and 501B including P+ diffusion materials to form respective p-channel type transistors. For example, the gate electrodes 502A and 502B may overlap with portions of the active region 501A and the gate electrodes 502B and 502C may overlap with portions of the active region 501B. In some embodiments, portions of the active region 501A may overlap with the gate electrodes 502A and 502B, and portions of the active region 50L B may overlap with the gate electrodes 502B and 502C. In the layout 500, each gate electrode of the gate electrodes 502A, 502B and 502C may be disposed in parallel. The source 504A may be disposed between the gate electrodes 502A and 502B. The source 504B may be disposed between the gate electrodes 502B and 502C.

Each of the p-channel type transistors 520A, 520B, 520C and 520D may include a gate. For example, the p-channel type transistor 520A may include a gate included in the gate electrode 502A that is between the drain 503A and the source 504A. The p-channel type transistor 520B may include a gate included in the gate electrode 502B that is between the drain 503B and the source 504A. The p-channel type transistor 520C may include a gate included in the gate electrode 502B that is between the drain 503C and the source 504B. The p-channel type transistor 520D may include a gate included in the gate electrode 502C that is between the drain 503D and the source 504B.

In some embodiments, each active region of the active regions 501A and 501B may have a center portion and two end portions disposed at ends of the center portion in the direction 510B. Each center portion may include a source and each end portion may include a drain. For example, the end portions 5012A, 5013A, 5012B, and 5013B may include drains 503A, 503B, 503C, and 503D of the transistors 520A, 520B, 520C and 520D, respectively. The center portion 5011A may include the source 504A shared by the transistors 520A and 520B and the center portion 501B may include the source 504B shared by the transistors 520C and 520D. A width of each contact of the sources 504A and 504B may be smaller than widths W1 and W3 of each respective center portion of the center portions 5011A and 50111B. In some embodiments, W1 and W3 may be the same.

In each active region, the widths of the end portions are greater than the width of the center portion. The active region 501A may include the center portion 5011A, the end portion 5012A disposed at an end 5014A of the center portion 5011A and another end portion 5013A disposed at another end 5015A of the center portion 5011A. The end portion 5012A and the center portion 5011A are in contact with each other at the end 5014A of the center portion 5011A in the direction 510A. The center portion 5011A and the end portion 5013A are in contact with each other at the other end 5015A of the center portion 5011A in the direction 510A. A width of the end portion 5012A may be defined by a distance between sides of the end portion 5012A that extend in the direction 510B. A width of the center portion 5011A W1 may be defined by a distance between sides of the center portion 5011A that extend in the direction 510B. A width W2 of the end portion 5013A may be defined by a distance between sides of the end portion 5013A that extend in the direction 510B. The width W2 of the end portion 5013A may be greater than the width W1 of the center portion 5011A. The width W1 of the portion 505B of the channel region of the transistor 520B of the side of the source 504A is smaller than the width W2 of the portion 505A of the transistor 520B of the channel region of the side of the drain 503B. In another example, the active region 5011B may include a center portion 50111B and an end portion 5012B disposed at an end 5014B of the center portion 50111B and another end portion 5013B disposed at another end 5015B of the center portion 50111B. The end portion 5012B and the center portion 5011B are in contact with each other at the end 5014B of the center portion 5011B that extends in the direction 510A. The center portion 5011B and the end portion 5013B are in contact with each other at the other end 5015B of the center portion 5011B that extends in the direction 510A. A width W4 of the end portion 5012B may be defined by a distance between sides of the end portion 5012B. A width W3 of the center portion 5011B may be defined by a distance between sides of the center portion 5011B that extend in the direction 510B. A width of the end portion 5013B may be defined by a distance between sides of the end portion 5013B that extend in the direction 510B. The width W4 of the end portion 5012B may be greater than the width of the center portion 5011B. The width W3 of the portion 505D of the channel region of the transistor 520C of the side of the source 504B is smaller than the width W4 of the portion 505C of the channel region of the transistor 520C of a side of the drain 503C.

In some embodiments, it may be desired to increase a distance L2 between each contact of each drain and its adjacent gate electrode to prevent leakage currents due to the gate induced drain leakage (GIDL). Each gate electrode of the gate electrodes 502A, 502B and 502C may have recess regions on sides that extend in the direction 510A. For example, the gate electrode 502A includes a recess region 5021A on a side that extends in the direction 510A. The contact of the drain 503A may be disposed within the recess region 5021A and may maintain a distance from the gate electrode 502A. Thus, the recess region 5021A may provide a distance L2 between the contact of the drain 503A and the gate electrode 502A. The gate electrode 502B may include a recess region 5021B on a side that extends in the direction 510A. The contact of the drain 503B may be disposed within the recess region 5021B and may maintain a distance L2 from the gate electrode 502B. Thus, the recess region 5021B may provide a distance L2 between the contact of the drain 503B and the gate electrode 502B. The gate electrode 502B may include another recess region 5021C on another side that extends in the direction 510A. The contact of the drain 503C may be disposed within the recess region 5021C and may maintain a distance L2 from the gate electrode 502B. Thus, the recess region 5021C may provide a distance L2 between the contact of the drain 503C and the gate electrode 502B. The gate electrode 502C includes a recess region 5021D on a side that extends in the direction 510A. The contact of the drain 503D may be disposed within the recess region 5021D and may maintain a distance L2 from the gate electrode 502C. The recess region 50211D may provide a distance L2 between the contact of the drain 503D and the gate electrode 502C. Thus, active regions having end portions with a greater width that provide the greater distance L2 may prevent the GIDL between drains and adjacent gate electrodes.

In some embodiments, it may be desired to increase the distance between adjacent active regions overlapped by the same gate electrode to prevent leakage currents due to the hot electron induced punch-through (HEIP). For example, the width W2 of the end portion 5013A of the active region 501A may include an overlapping width L1 with the gate electrode 502B next to the recess region 5021B and include the width L2 between the contact of the drain 503B and sides of the recess region 5021B that extend in the direction 510B. The width of the center portion 5011B W3 of the active region 501B may be smaller than the width W4 of the end portion 5012B of the active region 501B. The end portion 5013A of the active region 501A and the center portion 5011B of the active region 501B may be adjacent to each other on the side of the gate electrode 502b having the recess region 5021B. A distance L3 between the end portion 5013A of the active region 501A and the center portion 5011B of the active region 5011B may be provided. The distance L3 may be provided by having the width W3 of the center portion 5011B of the active region 5011B including the portion 505D of the channel region of the transistor 520C smaller than the width W4 of the end portion 5012B of the active region 501B including the portion 505C of the channel region of the transistor 520C. Increasing the distance 13 by having a smaller width W3 of the center portion 5011B may prevent hot electrons around the drain of 503B of the p-channel type transistor 520B from affecting the source 504B of the adjacent p-channel type transistor 520C to lower a threshold voltage (Vth) of the p-channel type transistor 520C. Thus, active regions having center portions with a less width to provide the greater distance L3 may prevent the HEIP between drains and sources of adjacent transistors.

Semiconductor devices of FIGS. 1-5 provide various advantages in reducing leakage currents over conventional subword driver layouts. For example, active regions having end portions with a greater width allow large recess regions of gate electrodes overlapping drains. The large recess regions provide a greater distance between the drains and the gate electrodes. The greater distance between the drains and the gate electrodes described above as the embodiments of the current disclosure may reduce leakage currents, such as the GIDL, between the drains and the gate electrodes. For further example, the end portions of each active region have a width greater than a width of a center portion between the end portions. This configuration may provide a greater distance between an end portion of one active region including a drain and a center portion of another active region adjacent to the active region that includes a source. The greater distance between the end portion of the one active region and the center portion of the other active region described above as the embodiments of the current disclosure may reduce leakage currents between the drain in the one active region and the source of the other active region due to the HEIP.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. A semiconductor device comprising:
a gate electrode extending in a first direction, the gate electrode including a side extending in the first direction;
a first active region extending in a second direction perpendicular to the first direction, the first active region including:
a first center portion having a first width in the first direction; and
a first end portion at a first end of the first center portion, having a second width in the first direction, the second width greater than the first width; and
a second active region extending in the second direction, the second active region including:
a second center portion having a third width in the first direction; and
a second end portion disposed at a second end of the second center portion, having a fourth width in the first direction, the fourth width greater than the third width,
wherein the gate electrode is configured to overlap along the side with a portion of the first end portion and to overlap along the side with a portion of the second center portion, and wherein the gate electrode is configured to overlap along another side opposite to the side with a portion of the second end portion and to overlap along the other side with a portion of the first center portion.

2. The semiconductor device of claim 1, wherein the second center portion comprises a source and a contact of the source, and
wherein a width of the contact in the first direction is smaller than the first width.

3. A semiconductor device comprising:
a gate electrode extending in a first direction, the gate electrode including a side extending in the first direction;
a first active region extending in a second direction perpendicular to the first direction, the first active region including:
a first center portion having a first width in the first direction; and
a first end portion at a first end of the first center portion, having a second width in the first direction, the second width greater than the first width; and
a second active region extending in the second direction, the second active region including:
a second center portion having a third width in the first direction; and
a second end portion disposed at a second end of the second center portion, having a fourth width in the first direction, the fourth width greater than the third width,
wherein the gate electrode is configured to overlap along the side with a portion of the first end portion and to overlap along the side with a portion of the second center portion, wherein the first end portion comprises a drain,
wherein the gate electrode has a recess region along the side, and
wherein the recess region is configured to provide a distance between a contact of the drain and the gate electrode.

4. The semiconductor device of claim 3, wherein the second width of the first end portion is greater than a width of the recess region in the first direction.

5. A semiconductor device comprising:
an area including a plurality of transistors of a same type, the area comprising:
a gate electrode extending in a first direction;
a first sub-region extending in a second direction perpendicular to the first direction, the first sub-region including a first active region, the first active region including:
a first center portion having a first width in the first direction; and
a first end portion in contact with the first center portion, the first end portion having a second width in the first direction; and
a second sub-region adjacent to the first sub-region, extending in the second direction, and including a second active region, the second active region including:
a second center portion having the first width in the first direction; and
a second end portion in contact with the second center portion, the second end portion having the second width in the first direction,
wherein the second width is greater than the first width,
wherein the gate electrode includes a side extending in the first direction, and wherein the gate electrode is configured to overlap with a portion of the first end portion and a portion of the second center portion along the side, wherein the first end portion comprises a drain,
wherein the gate electrode has a recess region along the side, and
wherein a contact of a drain is disposed in the recess region with a distance from the gate electrode.

6. The semiconductor device of claim 5, wherein the second width of the first end portion is greater than a width of the recess region in the first direction.

7. The semiconductor of claim 5, wherein the gate electrode is coupled a main word line, and
wherein the contact of the drain is coupled to a word line coupled to a memory cell.

8. The semiconductor of claim 7, wherein the first center portion comprises a source coupled to a word driver line.

9. The semiconductor of claim 8, further comprising another area,
wherein the area comprises p-channel type transistors including a first transistor comprising a gate included in the gate electrode, the drain in the first end portion, and the source in the first center portion, and
wherein the other area comprises n-channel type transistors.

10. The semiconductor device of claim 9, wherein the n-channel type transistors include:
a second transistor including:
a gate coupled to the main word line;
a source coupled to a non-active potential; and
a drain coupled to the word line; and
a third transistor including:
a gate coupled to another word driver line configured to transmit a signal complementary to a signal of the word driver line;
a source coupled to the non-active potential; and
a drain coupled to the word line.

11. A semiconductor device comprising:
a first subword driver including a first transistor comprising:

a first gate, a first drain and a first source;
a second subword driver including a second transistor comprising:
a second gate, a second drain and a second source;
a gate electrode comprising the first gate and the second gate, and having a side along a first direction;
a first active region extending in a second direction perpendicular to the first direction, the first active region including:
a first center portion having a first width in the first direction and comprising the first source; and
a first end portion having a second width greater than the first width in the first direction and comprising the first drain; and
a second active region extending in the second direction, the second active region including:
a second center portion comprising the second source and having a third width; and
a second end portion comprising the second drain and having a fourth width greater than the third width,
wherein the gate electrode is configured to overlap along the side with a portion of the first end portion and to overlap along the side with a portion of the second center portion.

12. The semiconductor device of claim 11, wherein the first transistor and the second transistor are p-channel type transistors.

13. The semiconductor device of claim 11, wherein the gate electrode has a recess region along the side, and
wherein the recess region is configured to provide a distance between a contact of the first drain and the gate electrode.

14. The semiconductor device of claim 13, wherein the second width of the first end portion is greater than a width of the recess region in the first direction.

15. The semiconductor of claim 13, wherein the contact of the first drain is coupled to a word line coupled to a memory cell.

16. The semiconductor device of claim 15, wherein the gate electrode is coupled to a main word line.

17. The semiconductor device of 14, wherein the gate electrode is configured to overlap along another side opposite to the side with a portion of the second end portion and to overlap along the other side with a portion of the first center portion along another side opposite to the side.

18. A semiconductor device comprising:
a gate electrode extending in a first direction;
a first active region extending in a second direction perpendicular to the first direction across the gate electrode, the first active region including:
a first source/drain region,
a second source/drain region; and
a first channel region therebetween, and the first channel region of a side of the first source/drain region has a width smaller than a width of the first channel region of a side of the second source/drain region; and
a second active region extending in the second direction across the gate electrode, the second active region including:
a third source/drain region;
a fourth source/drain region; and
a second channel region therebetween, the second channel region of a side of the third source/drain region has a width smaller than a width of a side of the fourth source/drain region,
wherein the second channel region of the side of the third source/drain region is arranged adjacent to the second source/drain region in the first direction, and
wherein the first channel region of the side of the first source/drain region is arranged adjacent to the fourth source/drain region in the first direction.

19. The semiconductor device of claim 18, wherein the second source/drain region is coupled to a word line and the fourth source/drain region is coupled to another word line.

20. The semiconductor device of claim 18, wherein the first source/drain region is coupled to a word driver line and the second source/drain region is coupled to another word driver line.

21. The semiconductor device of claim 18, wherein the gate electrode is coupled to a main word line.

* * * * *